United States Patent [19]

Rahman et al.

[11] Patent Number: 5,521,052
[45] Date of Patent: May 28, 1996

[54] METAL ION REDUCTION IN NOVOLAK RESIN USING AN ION EXCHANGE CATALYST IN A POLAR SOLVENT AND PHOTORESISTS COMPOSITIONS THEREFROM

[75] Inventors: M. Dalil Rahman, Flemington; Daniel P. Aubin, Oxford; Dinesh N. Khanna, Flemington, all of N.J.; Douglas McKenzie, Easton, Pa.

[73] Assignee: Hoechst Celanese Corporation, Somerville, N.J.

[21] Appl. No.: 365,659

[22] Filed: Dec. 30, 1994

[51] Int. Cl.⁶ ............................ G03F 07/004; G03F 7/30; B01J 41/00; C08G 8/12
[52] U.S. Cl. .................. 430/270.1; 430/311; 430/905; 430/188; 210/660; 210/681; 210/688; 528/129; 437/229
[58] Field of Search ........................ 430/188, 270, 430/311, 905; 210/660, 681, 688; 528/129; 437/229

[56] References Cited

U.S. PATENT DOCUMENTS

| | | | |
|---|---|---|---|
| 2,929,808 | 4/1956 | Ross et al. | 260/94.9 |
| 4,033,909 | 7/1977 | Papa | 260/59 R |
| 4,033,910 | 7/1977 | Papa | 260/2.5 F |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,747,954 | 5/1988 | Vaughn et al. | |
| 4,784,937 | 11/1988 | Tanaka et al. | 430/331 |
| 4,833,067 | 5/1989 | Tanaka et al. | 430/331 |
| 4,914,006 | 6/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,284,930 | 2/1994 | Matsumoto et al. | 430/281 X |
| 5,286,606 | 2/1994 | Rahman et al. | 430/311 |
| 5,350,714 | 9/1994 | Trefonas, III et al. | 210/663 X |
| 5,378,802 | 1/1995 | Honda | 210/681 X |

FOREIGN PATENT DOCUMENTS

| | | |
|---|---|---|
| 544325 | 6/1993 | European Pat. Off. . |
| 544324 | 6/1993 | European Pat. Off. . |
| 1072155 | 3/1989 | Japan . |
| 1-228560 | 9/1989 | Japan . |
| 4-65415 | 3/1992 | Japan . |
| 1509354 | 5/1978 | United Kingdom . |
| 94/14858 | 5/1978 | WIPO . |
| 93/12152 | 6/1993 | WIPO . |
| 93/18437 | 9/1993 | WIPO . |
| 94/01807 | 1/1994 | WIPO . |
| 94/12912 | 6/1994 | WIPO . |
| 94/14863 | 7/1994 | WIPO . |

OTHER PUBLICATIONS

Bayard; "Water Free of Heavy Metals for Medical Use and Ion Exchange Resin Used in its Preparation"; Nov. 16, 1992; CA98(26).221589z.

Hirai et al; "Treatment of Waste Waters Containing Formaldehyde and Metals with Chelating Ion Exchange Resins"; Nov. 5, 1975; CA84(14):95328j.

Kimura et al; "Purification of Formaldehyde"; Mar. 9, 1977; CA87(7):52776y.

Journal of the Electrochemical Society, vol. 137, No. 12, Dec. 1990, Manchester, New Hampshire US, pp. 3900–393905, XP0001681, T. Tanada "A New Photolithography Tech. w/Antireflective".

(List continued on next page.)

Primary Examiner—Cynthia Hamilton
Attorney, Agent, or Firm—Andrew F. Sayko, Jr.

[57] ABSTRACT

The present invention provides methods for producing water insoluble, aqueous alkali soluble, film forming novolak resins having an extremely low level of metal ions, utilizing treated anion and cation exchange resins. A method is also provided for producing photoresist composition having a very low level of metal ions from such novolak resin and for producing semiconductor devices using such photoresist compositions.

9 Claims, No Drawings

OTHER PUBLICATIONS

CA98(26):2215892, Bayard et al "Waterfree of heavy metals for medical use and ion exchange resin used in its preparation", Fr. De mande 2506286, 15 pages, Nov. 26, 1982.

CA84(14):95328 ; Hirai et al, "Treatment of waste waters containing formaldehyde and metals with chelating ion-exchange resins" Japan Kokai 4 pages, 50138651, Nov. 5, 1975.

Chemical Abstracts, vol. 112, No. 18, Apr. 30, 1990, Columbus, OH, p. 17, the Abstract 159201u, JP-A-1190713 (Inatomi, Shigeki et al ) Jul. 31, 1989.

"Amberlite Ion Exchange Resins Laboratory Guide" by Rohm and HAAS Company, Philadelphia, PA, Sep. 1979.

Grant et al, *Grant & Hackh's Chemical Dictionary,* 5th ed, McGraw-Hill Book Company, New York, NY, 1987, p. 459.

Morrison et al, *Organic Chemistry*, 3rd Edition, Allyn and Bacon, Inc, Boston, MASS, pp. 23–25, 619–620.

*Amber–Hi–Lites*, Rohm and Haas Company, IonExchange Dept., Philadelphia, Pennsylvania, Jan. 1971.

5,521,052

METAL ION REDUCTION IN NOVOLAK RESIN USING AN ION EXCHANGE CATALYST IN A POLAR SOLVENT AND PHOTORESISTS COMPOSITIONS THEREFROM

BACKGROUND OF THE INVENTION

The present invention relates to a process for producing a water insoluble, aqueous alkali soluble, film forming novolak resin having an extremely low level of metal ions. The present invention also relates to a process for making light-sensitive compositions useful in positive-working photoresist compositions. Further, the present invention relates to a process for coating substrates with these light-sensitive compositions as well as the process of coating, imaging and developing these light-sensitive mixtures on substrates.

Photoresist compositions are used in microlithography processes for making miniaturized electronic components, such as in the fabrication of computer chips and integrated circuits. Generally, in these processes, a thin coating of film of a photoresist composition is first applied to a substrate material, such as silicon wafers used for making integrated circuits. The coated substrate is then baked to evaporate substantially all of the solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in photoresists, can cause contamination especially during plasma stripping. However, these problems have been overcome to a substantial extent during the fabrication process. For example, by utilizing HCl gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems has been found to be the metal contamination in the photoresist, particularly sodium and iron ions. Metal levels as low as 1.0 ppm in the photoresist have been found to adversely affect the properties of such semiconductor devices.

Novolak resins are frequently used as a film forming polymeric binder in liquid photoresist formulations. These resins are typically produced by conducting a condensation reaction between formaldehyde and one or more multi-substituted phenols, in the presence of an acid catalyst, such as oxalic acid or maleic anhydride.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for producing novolak resin containing extremely low levels of metal ions. The invention further relates to a process for making positive-working photoresists containing these novolak resin and a photosensitizer, and to a process for using such photoresists in producing semiconductor devices.

The process of the subject invention provides water insoluble, aqueous alkali soluble, film forming novolak resins obtained by condensing, in a solvent, a mixture of one or more methyl phenols and formaldehyde, in the presence of acid catalyst. After the condensation reaction is completed, the novolak resin is isolated by a distillation process to remove the water, unreacted formaldehyde, unreacted methyl phenols and the reaction solvent. A suitable solvent, or a mixture of solvents, containing at least one polar solvent is added to the novolak resin.

The novolak resin obtained have extremely low levels of metal ions, such as iron, sodium, potassium, calcium, magnesium, copper and zinc. The metal ion level is less than 500 ppb each. Sodium and iron are the most common metal ion contaminants and among the easiest to detect. The level of these metal ions serves as an indicator of the level of other metal ions. The level of sodium and iron ions are, respectively, less than 100 ppb and 400 ppb each, preferably less than 75 ppb and 300 ppb, more preferably less than 50 ppb and 200 ppb, even more preferably less than 30 ppb and 130 ppb and most preferably less than 10 ppb and 10 ppb each.

Water insoluble, aqueous alkali soluble, film forming novolak resins having extremely low level of metal ions may be obtained by condensing a mixture of one or more methyl phenols and formaldehyde, in presence of an acid catalyst, in a suitable solvent. After the condensation reaction is completed, the novolak resin is isolated by a distillation process to remove the water, unreacted formaldehyde, unreacted methyl phenols and the solvent. A suitable polar solvent, or a mixture of solvents, containing a polar solvent is added to the novolak resin. This water insoluble, aqueous alkali soluble, film forming novolak resin having extremely low level of metal ions may also be obtained by: 1) filtering the novolak resin through a 0.1 μm filter, followed by utilization of a cation exchange resin or 2) by utilizing a combination of an anion and a cation exchange resin to purify such novolak resin in a polar solvent or a mixture of polar and non polar solvents followed by removing the solvent and then adding or adjusting the solvent level by adding a solvents which is same as the solvent(s) used for photoresist composition.

DETAILED DESCRIPTION OF THE PREFERRED EMBODIMENTS

The present invention provides a process for producing novolak resin having an extremely low level of metal ions. In one embodiment, the process utilizes a cation exchange resin to purify the novolak resin solution in a mixture of a polar and a non polar solvent. In a particularly preferred embodiment, the subject process utilizes an anion exchange resin followed by purification of the same solution with a cation exchange resin. The subject process comprises:

a) rinsing a cation exchange resin with deionized (DI) water, followed by rinsing with a mineral acid solution (e.g. a 5–98% solution of sulfuric, nitric or hydrochloric acid), followed by rinsing again with DI water, and thereby reducing the level of sodium and iron ions in the cation exchange resin to less than 200 ppb each, preferably less than 100 ppb, more preferably less than 50 ppb and most preferably no more than 20 ppb;

b) rinsing an anion ion exchange resin with DI water, followed by rinsing with a mineral acid solution (e.g. a 5–98% solution of sulfuric, nitric or hydrochloric acid), followed by rinsing again with DI water, then rinsing with an electronic grade non-metallic (e.g. ammonium) hydroxide solution (normally a 4–28% solution), followed by rinsing again with DI water, and thereby reducing the level of sodium and iron ions in the anion exchange resin to less than 200 ppb each, preferably less than 100 ppb, more preferably less than 50 ppb and most preferably no more than 20 ppb;

c) dissolving the novolak resin in a polar solvent, or in a mixture of a polar and a non polar solvent, and passing the novolak resin solution through the anion ion exchange resin followed by passing the solution through a cation exchange resin, and thereby reducing the level of metals to less than 100 ppb each, preferably less than 50 ppb, more preferably less than 25 ppb and most preferably less than 10 ppb;

d) distilling the resin solution and thereby removing the polar solvent(s), followed by addition of or adjusting of the solvent level with a solvent which is the same solvent used for photoresist compositions and producing a novolak resin solution having metal levels of less than 200 ppb each, preferably 100 ppb, more preferably less than 50 ppb and even more preferably less than 10 ppb.

The present invention further provides a process for producing a positive photoresist composition having a very low level of metal ions. The subject process comprises:

a) rinsing a cation exchange resin with DI water, followed by rinsing with a mineral acid solution (e.g. a 5–98% solution of sulfuric, nitric or hydrochloric acid) followed by rinsing again with DI water and thereby reducing the level of sodium and iron ions in the ion exchange resin to less than 200 ppb each, preferably less than 100 ppb, more preferably less than 50 ppb and most preferably no more than 20 ppb;

b) rinsing an anion exchange resin with DI water, followed by rinsing with a mineral acid solution (e.g. a 5–98% solution of sulfuric, nitric or hydrochloric acid) followed by rinsing again with DI water, then rinsing with an electronic grade non-metallic (e.g. ammonium) hydroxide solution (e.g. a 4–28% solution), followed by rinsing again with DI water, and thereby reducing the level of sodium and iron ions in the anion exchange resin to less than 200 ppb each, preferably less than 100 ppb, more preferably less than 50 ppb and most preferably no more than 20 ppb;

c) forming a solution of the novolak resin in a polar solvent, or in a mixture of polar and non polar solvents, and passing the novolak resin solution through the anion exchange resin, followed by passing the novolak resin solution through the cation exchange resin, and thereby reducing the level of metal ions to less than 100 ppb each, preferably less than 50 ppb, more preferably less than 25 ppb and most preferably less than 10 ppb;

d) distilling the novolak resin solution and thereby removing the polar solvent(s), followed by addition of or adjusting a solvent which is same solvent used for the photoresist composition and producing a novolak resin having a metal ion level of less than 200 ppb each, preferably 100 ppb, more preferably less than 50 ppb, even more preferably less than 10 ppb;

e) providing an admixture of: 1) a photosensitive component in an amount sufficient to photosensitize the photoresist composition; 2) the water insoluble, aqueous alkali soluble, film forming novolak resin having a low level of total metal ions and 3) a suitable solvent.

The invention further provides a method for producing a semiconductor device by producing a photo-image on a substrate by coating a suitable substrate with a positive working photoresist composition, the process comprising:

a) rinsing a cation exchange resin with DI water, followed by rinsing with a mineral acid solution (e.g. a 5–98% solution of sulfuric, nitric or hydrochloric acid) followed by rinsing again with DI water, and thereby reducing the level of sodium and iron ions in the cation exchange resin to less than 200 ppb each, preferably less than 100 ppb, more preferably less than 50 ppb and most preferably no more than 20 ppb;

b) rinsing an anion exchange with DI water, followed by rinsing with a mineral acid solution (e.g. a 5–98% solution of sulfuric, nitric or hydrochloric acid) followed by rinsing again with DI water, then rinsing with an electronic grade non-metallic (e.g. ammonium) hydroxide solution (e.g. a 4–28% solution), followed by rinsing again with DI water, and thereby reducing the level of sodium and iron ions in the anionic ion exchange resin to less than 200 ppb each, preferably less than 1 00 ppb, more preferably less than 50 ppb and most preferably no more than 20 ppb;

c) forming a novolak resin solution by dissolving the novolak resin in a polar solvent, or in a mixture of polar and non polar solvents, and passing the novolak resin solution through the anion exchange resin, followed by passing the novolak resin solution through the cation exchange resin, and thereby reducing the level of metal ions to less than 100 ppb each, preferably less than 50 ppb, more preferably less than 25 ppb and most preferably less than 10 ppb;

d) distilling the novolak resin solution and thereby removing the solvent(s), followed by adding or adjusting the solvent which is same solvent used for photoresist compositions and producing a novolak resin having a metal ion level of less than 200 ppb each, preferably 100 ppb, more preferably less than 50 ppb even more preferably less than 10 ppb;

e) providing an admixture of: 1) a photosensitive component in an amount sufficient to photosensitize the photoresist composition; 2) the water insoluble, aqueous alkali soluble, film forming novolak resin having a low level of total metal ions and 3) a suitable solvent, and thereby producing a photoresist composition;

f) coating a suitable substrate with the photoresist composition;

g) heat treating the coated substrate until substantially all of the solvent is removed; image-wise exposing the photosensitive composition and removing the image-wise exposed areas of such composition with a suitable developer, such as an aqueous alkaline developer. Optionally one may perform a baking of the substrate either immediately before or after the removing step.

It has been found that a film forming novolak resin having an extremely low level of metal ion contamination cannot readily be obtained by first condensing anethylphenols and formaldehyde, in the presence of a catalyst, isolated the condensate resin in non polar solvents, then attempting to remove the metal ions from the novolak resin unless: 1) it is first dissolved in a polar solvent, or a mixture of solvents containing polar solvent (2) the novolak resin is then passed through an anion exchange resin, such as Amberlyst®21, followed by passing the novolak resin solution through a cation exchange resin, such as Amberlyst®15, (3) the ion exchange resins having both been cleaned as described above, (5) a solvent which is compatible with the solvent or solvents for the novolak resin solution is used to rinse both ion exchange resins, prior to passing the novolak resin solution through the ion exchange resins to remove metal ions.

It was unexpectedly found that addition of a polar solvent such as methanol, ethanol, acetone, mixtures thereof, or a mixture of a polar and nonpolar solvent to a novolak resin solution, or the use of such a solvent to form a novolak resin solution, greatly facilitating the removal of metal ions, to produce a film forming novolak resin having an extremely low level of metal ion contamination. It was also found that novolak resin solution in a pure polar solvent, or in a mixture of polar solvents, would give substantially the same results. However, a novolak resin solution in a pure non polar solvent, such as PGMEA, did not deionize nearly as well, except in the case of sodium.

A cation exchange resin, such as a styrene/divinylbenzene cation exchange resin is utilized in the present process. Such cation exchange resins are available from Rohm and Haas Company, e.g. AMBERLYST® 15 resin. These resins typically contain as much as 80,000 to 200,000 ppb each of sodium and iron. Before being utilized in the process of the invention, the ion exchange resin must be treated with water and then a mineral acid solution to reduce the metal ion level. The cation exchange resin is initially rinsed with deionized water, followed by a mineral acid solution, such as a 10 percent sulfuric acid solution, rinsed again with deionized water, rinsed again with the mineral acid solution and once again rinsed with deionized water. It is also critical that, prior to deionization of the novolak resin solution, both ion exchange resins are rinsed with a solvent which is the same as, or at least compatible with, the novolak resin solvent.

The novolak resin is preferably dissolved in a mixture of a non polar solvent, such as propylene glycol methyl ether acetate and a polar solvent such as methanol in the solvent ratio of from about 1:2 to 2:1, preferably about 1:1 with a novolak resin solids content of from about 5 percent to about 30%, preferably from about 15% to about 25%. The novolak resin solution may be passed through a column containing the ion exchange resins. Such novolak resin solutions typically contain from about 250 to 1500 ppb each of sodium and iron ions. During the process of the present invention, these levels are reduced to as low as 10 ppb each.

The present invention provides a process for producing a photoresist composition and a process for producing semiconductor devices using such photoresist composition. The photoresist composition is formed by providing an admixture of a photosensitizer, the subject water insoluble, aqueous alkali soluble, film forming novolak resin and a suitable solvent. Suitable solvents for such photoresists and for novolak resins may include propylene glycol mono-alkyl ether, propylene glycol alkyl (e.g. methyl) ether acetate, ethyl-3-ethoxypropionate, ethyl lactate, mixtures of ethyl-3-ethoxypropionate and ethyl lactate, butyl acetate, xylene, diglyme, ethylene glycol monoethyl ether acetate. The preferred solvents are propylene glycol methyl ether acetate (PGMEA), ethyl-3-ethoxypropionate (EEP) and 3-methoxy-3-methyl butanol.

Other optional ingredients such as colorants, dyes, antistriation agents, leveling agents, plasticizers, adhesion promoters, speed enhancers, solvents and such surfactants as non-ionic surfactants may be added to the solution of PHS, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of PHS and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; para-methyl-disilane-methyl methacrylate; vinyltrichlorosilane; and gamma-amino-propyl triethoxysilane up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

80 grams of wet Amberlyst®21 anion exchange resin beads were placed in a conical flask and deionized water was added so that all of the resin beads were under water. The flask was sealed and allowed to stand overnight to swell the resin beads. The next morning the water was decanted, more deionized water added to cover the resin beads and the flask was shaken slowly. The water was again decanted. The rinsing with deionized water and decanting steps were repeated three additional times. The resulting slurry of anion exchange resin was poured into a glass column having a diameter equipped with a porous disk and a stopcock. The resin was allowed to settle to the bottom and the column was back flushed with deionized water for 25 minutes. The resin was again allowed to settle to the bottom.

The bed length was measured and the bed volume was calculated as 125 ml. A 10 percent sulfuric acid solution was passed down through the resin bed at a rate of about 10 ml./min. 6 bed volumes of the acid solution were passed through the resin bed. An amount of deionized water sufficient to remove the acid was then passed down through the resin bed at about the same flow rate. Six bed volumes of a 6 percent ammonium hydroxide solution was passed down through the column at the same rate, followed by about 60 bed volumes of DI water to remove ammonium hydroxide. The pH of the effluent water was measured to assure that it matched the pH of 6.0 for fresh deionized water. 2 bed volumes of electronic grade methanol was passed down through the column to remove water, 55 grams of dry AMBERLYST®15 ion exchange resin beads were placed in a conical flask and deionized water was added so that all of the resin beads were under water. The flask was sealed and allowed to stand overnight to swell the resin beads. The next morning the water was decanted, deionized water was added to cover the resin beads and the flask was shaken slowly. The water was again decanted. The rinsing with deionized water and decanting steps were repeated three additional times. The resulting slurry of anion exchange resin was poured into a glass column equipped with a porous disk and a stopcock. The resin was allowed to settle to the bottom and the column was back flushed with deionized water for 25 minutes. The resin was again allowed to settle to the bottom.

The bed length was measured and the bed volume was found to be 100 ml. A 10 percent sulfuric acid solution was passed down through the resin bed at a rate of about 10 ml./min. 6 bed volumes of the acid solution were passed down through the resin bed. 60 bed volumes of deionized water were then passed down through the resin bed at about the same flow rate. The pH of the effluent water was measured to assure that it matched the pH of 6.0 for fresh deionized water. Two bed volumes of electronic grade methanol were passed down through the column to remove the water.

330 g of novolak resin in PGMEA (40% solution) was added to a beaker and an equal amount of electronic grade methanol was added. The contents of the beaker was stirred and then passed through a 0.1 μm (mircrometer) filter through a cleaned and rinsed Amberlyst®21 ion exchange resin bed, followed by passage through an Amberlyst®15 ion exchange resin bed with a residence time of 12–15 minutes. The methanol was distilled off to obtain a novolak resin solution in PGMEA (40% solids). Metal analysis result before and after treatment are shown in Table 1 below.

TABLE 1

| Example | Metals | Before | After |
|---------|--------|--------|-------|
| 1       | Na     | 429    | 15    |
|         | Fe     | 156    | 7     |

EXAMPLE 2

48 lbs. of wet Amberlyst® A 21 anion exchange resin (38 lbs. dry) were placed in a 1.2 ft.$^3$ resin canister, having a pressure rating of 40 psig. Into a 500 gal. glass-lined feed kettle, having a pressure rating of 100 psig, an agitator and a 3 inch 101 psig rupture disk, was fed 100.0 gal. of deionized water. The feed kettle was pressurized to 20 psig, using nitrogen, and water was slowly transferred through a bottom outlet valve through the resin canister through a feed valve into a glass-lined product kettle, having a pressure rating of 150 psig and a 2 inch 100/100 psig double rupture disk. Both kettles were then drained.

With all valves closed, 55 gal. of 10% ammonium hydroxide solution (electronic grade, J. T. Baker) were charged to the feed kettle. The agitator was set at 60 rpm and the temperature was maintained at 20°–30° C. The feed kettle was pressurized to 20 psig, using nitrogen, and the bottom outlet valve was opened to slowly transfer the sulfuric acid solution through the resin canister through the open inlet valve to the product kettle. The inlet valve was opened to provide a liquid flow rate of about 0.35 gal./min. The feed kettle and product kettle were then drained, the feed kettle outlet valve to the resin canister was closed and the feed kettle was rinsed with deionized water.

450 gal. of deionized water was charged to the feed kettle; the temperature was maintained at 20°–30° C. and the agitator was set at 60 rpm. The feed kettle was pressurized to 20 psig, using nitrogen, and the bottom outlet valve opened to slowly transfer the water through the resin canister through the inlet valve to the product canister at a liquid flow rate of about 1.8 gal./min. The pH of the water in the product kettle was tested to assure that it matched the pH of 6.0 fresh deionized water. The contents of the feed and product canisters were completely drained after turning off the agitator and all valves were closed.

48 lbs. of wet Amberlyst® 15 cation exchange resin (38 lbs. dry) were placed in a 1.2 ft.$^3$ resin canister, having a pressure rating of 40 psig. Into a 500 gal. glass-lined feed kettle, having a pressure rating of 100 psig, an agitator and a 3 inch 101 psig rupture disk, was fed 100.0 gal. of deionized water. The feed kettle was pressurized to 20 psig, using nitrogen, and water was slowly transferred through a bottom outlet valve through the resin canister through a feed valve into a glass-lined product kettle, having a pressure rating of 150 psig and a 2 inch 100/100 psig double rupture disk. Both kettles were then drained.

With all valves closed, 55 gal. of deionized water and then 55 lbs. of 98 percent sulfuric acid were charged to the feed kettle. The agitator was set at 60 rpm and the temperature was maintained at 20°–30° C. The feed kettle was pressurized to 20 psig, using nitrogen, and the bottom outlet valve was opened to slowly transfer the sulfuric acid solution through the resin canister through the open inlet valve to the product kettle. The inlet valve was opened so as to obtain a liquid flow rate of about 0.35 gal./min. The feed kettle and product kettle were then drained, the feed kettle outlet valve to the resin canister was closed and the feed kettle was rinsed with deionized water.

450 gal. of deionized water was charged to the feed kettle; the temperature was maintained at 20°–30° C. and the agitator was set at 60 rpm. The feed kettle was pressurized to 20 psig, using nitrogen, and the bottom outlet valve opened to slowly transfer the water through the resin canister through the inlet valve to the product canister at a liquid flow rate of about 1.8 gal./min. The pH of the water in the product kettle was tested to assure that it matched the pH of 6.0 for fresh deionized water. The contents of the feed and product canisters were completely drained after turning off the agitator and all valves were closed.

55 gals. of a 40% solution of novolak resin in PGMEA was charged to the feed kettle and the temperature was maintained at 20°–30° C. 55 gals. of electronic grade methanol was added with agitation. The bottom outlet valve was opened slowly to transfer the solution through a 0.1 mm filter through an Amberlyst®21 resin canister, followed by an Amberlyst®15 resin canister at the rate of 0.7 gal./min. and then into the product kettle. The resin solution was distilled to remove methanol to obtain a substantially metals free novolak resin in a PGMEA solution. The metals number, in ppb, for untreated and treated resin is shown in Table 2 below.

EXAMPLE 3–5

The procedure of Example 2 was repeated three times and the results, in ppb of metals, are shown in Table 2 below.

TABLE 2

| Metals | Untreated | Example 2 | Example 3 | Example 4 | Example 5 |
|---|---|---|---|---|---|
| Na | 155 | <5 | <5 | <5 | <5 |
| K  |     | <5 | <5 | <5 | <5 |
| Fe | 297 | <5 | <5 | 56 | 24 |
| Cr | 10  | <5 | <5 | 6  | 7  |
| Cu |     | <5 | <5 | <5 | <5 |
| Pb |     | <5 | <5 | <5 |    |
| Mg |     | <5 | <5 |    |    |
| Zn |     | 7  | 27 |    |    |
| Ca |     | <5 | 7  | 87 | <5 |
| Al |     | <5 | <5 | 59 | <5 |
| Mn |     | <5 | <5 | <5 |    |
| Ni |     | 25 | 19 | 17 | 8  |

EXAMPLE 6

60 grams of dry AMBERLYST®15 ion exchange resin beads were placed in a conical flask and deionized water was added so that all of the resin beads were under water. The flask was sealed and allowed to stand overnight to swell the resin beads. The next morning the water was decanted, deionized water added to cover the resin beads and the flask was shaken slowly. The water was again decanted. The rinsing with deionized water and decanting steps were repeated three additional times. The resulting slurry of ion exchange resin was poured into a glass column having a porous disk and a stopcock. The resin was allowed to settle to the bottom and the column was back flushed with deionized water for 25 minutes. The resin was again allowed to settle to the bottom.

The bed length was measured and the bed volume was found to be 120 ml. A 10 percent sulfuric acid solution was passed down through the resin bed at a rate of about 12 ml./min (6 bed volumes of the acid solution were passed through the resin bed. 50 bed volumes of deionized water were then passed down through the resin bed at about the same flow rate. The pH of the effluent water was measured to assure that it matched the pH of 6 for fresh deionized water. A bed volume of metal free diglyme was passed through followed by a bed volume of PGMEA was passed through the column. 300 grams of novolak resin in PGMEA 30% was added to a beaker and 300 grams of PGMEA was added and the contents of the beaker were stirred for half an hour. The novolak resin solution was passed through the resin bed at the same flow rate. The resin solution was collected in a flask and distilled to remove methanol to obtain 40% solution (solids) in PGMEA. The metal analysis result of untreated and treated resin solution is shown below.

| Untreated | Fe | 500 ppb |
| Treated   | Fe | 57 ppb. |

EXAMPLE 7

A 50 gram photoresist test sample was prepared according to the following formulation:

| | |
|---|---|
| RI 292 [A mixture of photosensitizers: 2,1,5-(70%) and 2,1,4-(30%)- diazonaphthoquinone sulfonic acid ester (95% esterified) of trihydroxyphenyl ethane] | 2.51 gm |
| Resin from Example 1 | 11.46 gm |
| PGMEA | 36.00 gm |
| 10% FC-430 = [Fluoroaliphatic polymeric ester (98.5%), Toluene (1.5%) - available from 3M]PGMEA solution | 0.13 gm |

A 50 gm photoresist reference sample was prepared from this resin solution and compared with an identical comparative photoresist sample using qualified untreated novolak resin (Resin 72, m-cresol/3,5 xylenol —6.3/3 ratio, available from Hoechst Celanese Corp).

Photoresist Reference Sample

The photoresist test sample was coated on an HMDS (hexemethylene disilazane) primed silicon wafer to a 1.29 mm thickness and soft baked at 110° C. for 60 seconds on an I-line hot plate (SVG® 8100). The photoresist reference sample was also coated to a 1.29 mm thickness by the same procedure. The exposure matrix was printed on the coated wafers using a 0.54 NA NIKON® i-line stepper and a NIKON® resolution reticle. The exposed wafers were PEB (post exposure baked) at 110° C. for 60 seconds on a the I-line hot plate. The wafers were then developed using AZ® 300 MIF TMAH developer. The developed wafers were examined using a HITACHI® S-400 SEM (scanning electron microscope). A nominal dose (Dose to Print "DTP") was measured at the best focus, i.e. the dose required to precisely replicate a given feature. Photospeed, resolution and depth of focus latitude were measured and were substantially the same for all of the wafers, as shown below:

Photospeed: 165 mJ/cm$^2$

Resolution: 0.35 micron

Depth of focus: +0.6/−0.4 micron

The overall performance of novolak resin treated according to the process of the subject invention was as good as standard novolak resin which was untreated, as shown below.

| Example | RMW | DTC | DTP | Resolution | DOF |
|---|---|---|---|---|---|
| | | mJ/cm$^2$ | mJ/cm$^2$ | μm | 0.4 μm l/s |
| 6 | 10.8 | 126 | 225 | 0.35 | −0.2/0.4 |
| 7 | 9.5  | 220 | 370 | 0.35 | 0/0.6 |
| 8? | 8.8 | 80  | 145 | 0.40 | −0.4/0.2 |
| 9? | 8.5 | 70  | 130 | 0.35 | −0.6/0.4 |

We claim:

1. A method for producing a water insoluble, aqueous alkali soluble, film forming novolak resin comprising:

a) washing an anion exchange resin with deionized water, washing said anion exchange resin with a mineral acid solution, washing said anion exchange resin again with deionized water, washing said anion exchange resin with ammonium hydroxide, washing said anion exchange resin with deionized water again, and thereby reducing the level of sodium and iron ions in said anion exchange resin to less than 200 ppb each;

b) washing a cation exchange resin with deionized water, washing said cation exchange resin with a mineral acid solution, washing said cation exchange resin with deionized water and thereby reducing the level of sodium and iron ions in said cation exchange resin to less than 200 ppb each;

c) providing a solution of a novolak resin in a mixture of a polar and a nonpolar organic solvent, wherein the polar organic solvent is selected from the group consisting of acetone, methanol and ethanol, and wherein the nonpolar organic solvent is selected from the group consisting of propylene glycol methyl ether acetate, ethyl lactate, 2-heptanone, and ethyl-3-ethoxy-propionate, in a solvent ratio of from 2:1 to 1:2, passing said solution through a filter having a pore size of from 0.04 to 0.5 microns, passing said solution through said anion exchange resin and thereby reducing the level of sodium and iron ions in said solution to less than 200 ppb each;

d) then passing said novolak resin solution through said cation exchange resin and then distilling off the polar solvent to provide a solution of the novolak resin in the nonpolar solvent, having a sodium and iron ion content of less than 100 ppb each.

2. The method of claim 1 wherein said anion exchange resin and said cation exchange resin are both washed to reduce the level of sodium and iron ions to less than 100 ppb each.

3. The method of claim 1 wherein the level of sodium and iron ions in the novolak resin solution is reduced to less than 50 ppb each.

4. A method for producing a positive photoresist composition comprising:

a) washing an anion exchange resin with deionized water, washing said anion exchange resin with a mineral acid solution, washing said anion exchange resin again with deionized water, washing said anion exchange resin with ammonium hydroxide, washing said anion exchange resin with deionized water again, and thereby reducing the level of sodium and iron ions in said anion exchange resin to less than 200 ppb each;

b) washing a cation exchange resin with deionized water, washing said cation exchange resin with a mineral acid solution, washing said cation exchange resin with deionized water again, and thereby reducing the level of sodium and iron ions in said cation exchange resin to less than 200 ppb each;

c) providing a solution of a water insoluble, aqueous alkali soluble, film forming novolak resin in a mixture of a polar and a nonpolar organic solvent, wherein the polar organic solvent is selected from the group consisting of acetone, methanol and ethanol, and wherein the nonpolar organic solvent is selected from the group consisting of propylene glycol methyl ether acetate, ethyl lactate, 2-heptanone, and ethyl-3-ethoxypropionate, in a solvent ratio of from about 2:1 to about 1:2, passing said solution through a filter having a pore size of from about 0.04 to 0.5 micron, passing said solution through said anion exchange resin and thereby reducing the level of sodium and iron ions in said solution to less than 200 ppb each;

d) then passing said novolak resin solution through said cation exchange resin and then distilling off the polar solvent to provide a solution of the novolak resin in the nonpolar solvent, having a sodium and iron ion content of less than 100 ppb each;

e) providing an admixture of: 1) a photosensitive component in an amount sufficient to photosensitize the photoresist composition, 2) water insoluble, aqueous alkali soluble, film forming novolak resin obtained from said novolak resin solution produced from steps a) through d) and 3) a suitable photoresist solvent.

5. The method of claim 4 wherein said anion exchange resin and said cation exchange resin are both washed to reduce the sodium and iron ion level to less than 100 ppb each.

6. The method of claim 4 wherein said photoresist solvent is selected from the group consisting of propylene glycol methyl ether acetate, ethyl lactate, 2-heptanone and ethyl-3-ethoxypropionate.

7. A method for producing a semiconductor device by producing a photo-image on a suitable substrate comprising:

a) washing an anion exchange resin with deionized water, washing said anion exchange resin with a mineral acid solution, washing said anion exchange resin with deionized water again, washing said anion exchange resin with ammonium hydroxide, washing said anion exchange resin with deionized water again, and thereby reducing the level of sodium and iron ions to less than 200 ppb each;

b) washing a cation exchange resin with deionized water, washing said cation exchange resin with a mineral acid solution, washing said cation exchange resin with deionized water again and thereby reducing the level of sodium and iron ions in the cation exchange resin to less than 200 ppb each;

c) providing a solution of a novolak resin in a mixture of a polar and a nonpolar organic solvent, wherein the polar organic solvent is selected from the group consisting of acetone, methanol and ethanol, and wherein the nonpolar organic solvent is selected from the group consisting of propylene polycol methyl ether acetate, ethyl lactate, 2-heptanone, and ethyl-3-ethoxy-propionate, in a solvent ratio of from about 2:1 to about 1:2, passing said solution through a filter having a pore size of from 0.04 μm to 0.5 μm, passing said solution through said anion exchange resin and thereby reducing the total sodium and iron ion level of said solution to less than 200 ppb each;

d) then passing said novolak resin solution through said cation exchange resin, and then distilling off the polar solvent to provide a solution of the novolak resin in the nonpolar solvent, having a sodium and iron ion content of less than 100 ppb each;

e) providing a photoresist composition by providing an admixture of: 1) a photosensitive component in an amount sufficient to photosensitize the photoresist composition, 2) water insoluble, aqueous alkali soluble, film forming novolak resin obtained from said novolak resin solution produced from steps a) through d) and 3) a suitable photoresist solvent;

coating a suitable substrate with said photoresist composition;

g) heat treating the coated substrate until substantially all of the solvent is removed;

h) image-wise exposing said photoresist composition; and i) removing the image-wise exposed areas of said photoresist composition with a suitable developer.

8. The method of claim 7 wherein said anion exchange resin and said cation exchange resin are both washed to reduce the level of sodium and iron ions to less than 100 ppb.

9. The method of claim 7 wherein said photoresist solvent is selected from the group consisting of propylene glycol methyl ether acetate, 2-heptanone, ethyl lactate and ethyl-3-ethoxypropionate.

* * * * *